(12) United States Patent
Sawamoto et al.

(10) Patent No.: US 10,854,560 B2
(45) Date of Patent: Dec. 1, 2020

(54) SEMICONDUCTOR DEVICE AND SEMICONDUCTOR DEVICE MANUFACTURING METHOD

(71) Applicants: AOI Electronics Co., Ltd., Takamatsu (JP); Mitsubishi Electric Corporation, Tokyo (JP)

(72) Inventors: Shuichi Sawamoto, Yokohama (JP); Koji Iwabu, Takamatsu (JP); Katsuhiro Takao, Takamatsu (JP); Akihito Hirai, Mitoyo (JP); Joichi Saito, Goshogawara (JP)

(73) Assignees: AOI Electronics Co., Ltd., Takamatsu (JP); Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/502,803

(22) Filed: Jul. 3, 2019

(65) Prior Publication Data

US 2019/0326227 A1    Oct. 24, 2019

Related U.S. Application Data

(62) Division of application No. 15/742,071, filed as application No. PCT/JP2016/064925 on May 19, 2016.

(30) Foreign Application Priority Data

Jul. 7, 2015   (JP) ................................. 2015-136216

(51) Int. Cl.
   *H01L 23/552*   (2006.01)
   *H01L 23/31*    (2006.01)
   (Continued)

(52) U.S. Cl.
   CPC ........ *H01L 23/552* (2013.01); *H01L 21/4842* (2013.01); *H01L 21/561* (2013.01);
   (Continued)

(58) Field of Classification Search
   CPC . H01L 23/552; H01L 23/49541; H01L 24/97; H01L 23/3121; H01L 21/561;
   (Continued)

(56) References Cited

U.S. PATENT DOCUMENTS 5,643,433 A * 7/1997 Fukase ................ H01L 21/4821
                                                        205/122
6,423,643 B1   7/2002 Furuhata et al.
(Continued)

FOREIGN PATENT DOCUMENTS

CN        100382296 C      4/2008
CN        100561732 C     11/2009
(Continued)

OTHER PUBLICATIONS

International Search Report (PCT/ISA/210) issued in PCT Application No. PCT/JP2016/064925 dated Jun. 14, 2016 with English translation (4 pages).
(Continued)

*Primary Examiner* — Selim U Ahmed
(74) *Attorney, Agent, or Firm* — Crowell & Moring LLP

(57)    ABSTRACT

A semiconductor device includes: an island that is formed by a metallic layer including a single metallic layer or a plurality of different metallic layers; a semiconductor chip provided upon an upper surface of the island, and having a pair of side portions mutually opposing each other; a plurality of signal terminals disposed at an external periphery of at least the pair of side portions of the semiconductor chip, and formed by the metallic layer; a grounding terminal disposed at an external periphery of the plurality of signal
(Continued)

terminals, and formed by the metallic layer; electrically conductive connection members that are connected between each of a plurality of electrodes of the semiconductor chip and each of the plurality of signal terminals; sealing resin that seals the island, the semiconductor chip, the electrically conductive connection members, the plurality of signal terminals, and the grounding terminal, so that a lower surface of the island, lower surfaces of the plurality of signal terminals, and a lower surface of the grounding terminal are exposed to the exterior; and a metallic shielding layer that covers over an outer peripheral side surface and an upper surface of the sealing resin, and a portion of the grounding terminal.

6 Claims, 13 Drawing Sheets

(51) Int. Cl.
    *H01L 21/56*     (2006.01)
    *H01L 23/00*     (2006.01)
    *H01L 21/48*     (2006.01)
    *H01L 23/495*     (2006.01)

(52) U.S. Cl.
    CPC ........ *H01L 21/568* (2013.01); *H01L 23/3121* (2013.01); *H01L 23/49541* (2013.01); *H01L 24/97* (2013.01); *H01L 23/49548* (2013.01); H01L 2224/32245 (2013.01); H01L 2224/48091 (2013.01); H01L 2224/48247 (2013.01); H01L 2224/73265 (2013.01); H01L 2224/83005 (2013.01); H01L 2224/85005 (2013.01); H01L 2224/97 (2013.01)

(58) Field of Classification Search
    CPC ................... H01L 21/568; H01L 23/00; H01L 2224/83005; H01L 2224/85005; H01L 2224/32245; H01L 2224/48091; H01L 2224/48247; H01L 2224/97; H01L 2224/73265
    See application file for complete search history.

(56) References Cited

U.S. PATENT DOCUMENTS

| | | |
|---|---|---|
| 8,053,872 B1 | 11/2011 | Swan et al. |
| 10,396,039 B2 | 8/2019 | Mizutani et al. |
| 2004/0080026 A1 | 4/2004 | Minamio et al. |
| 2006/0051899 A1* | 3/2006 | Lien .................... H01L 23/3114 |
| | | 438/123 |
| 2007/0164409 A1 | 7/2007 | Holland |
| 2010/0140759 A1* | 6/2010 | Pagaila ................. H01L 21/565 |
| | | 257/660 |
| 2011/0180933 A1* | 7/2011 | Inoue .................... H01L 21/561 |
| | | 257/774 |
| 2012/0074544 A1 | 3/2012 | Masuda et al. |
| 2012/0193770 A1 | 8/2012 | Yamada et al. |
| 2012/0205790 A1* | 8/2012 | Haga .................... H01L 21/4842 |
| | | 257/676 |
| 2012/0241922 A1 | 9/2012 | Pagaila |
| 2016/0079186 A1 | 3/2016 | Narita |

FOREIGN PATENT DOCUMENTS

| | | |
|---|---|---|
| JP | 2006-206696 A | 8/2006 |
| JP | 2011-151323 A | 8/2011 |
| JP | 2011-228322 A | 11/2011 |
| JP | 2012-160578 A | 8/2012 |
| JP | 2012-209317 A | 10/2012 |
| JP | 2013-165157 A | 8/2013 |
| JP | 2013-197209 A | 9/2013 |
| JP | 2013-235999 A | 11/2013 |
| JP | 2014-183142 A | 9/2014 |
| WO | WO 2005/050699 A2 | 6/2005 |

OTHER PUBLICATIONS

Japanese-language Written Opinion (PCT/ISA/237) issued in PCT Application No. PCT/JP2016/064925 dated Jun. 14, 2016 (4 pages).
Office Action issued in counterpart U.S. Appl. No. 15/742,071 dated Jul. 29, 2019 (11 pages).

* cited by examiner

FIG.1
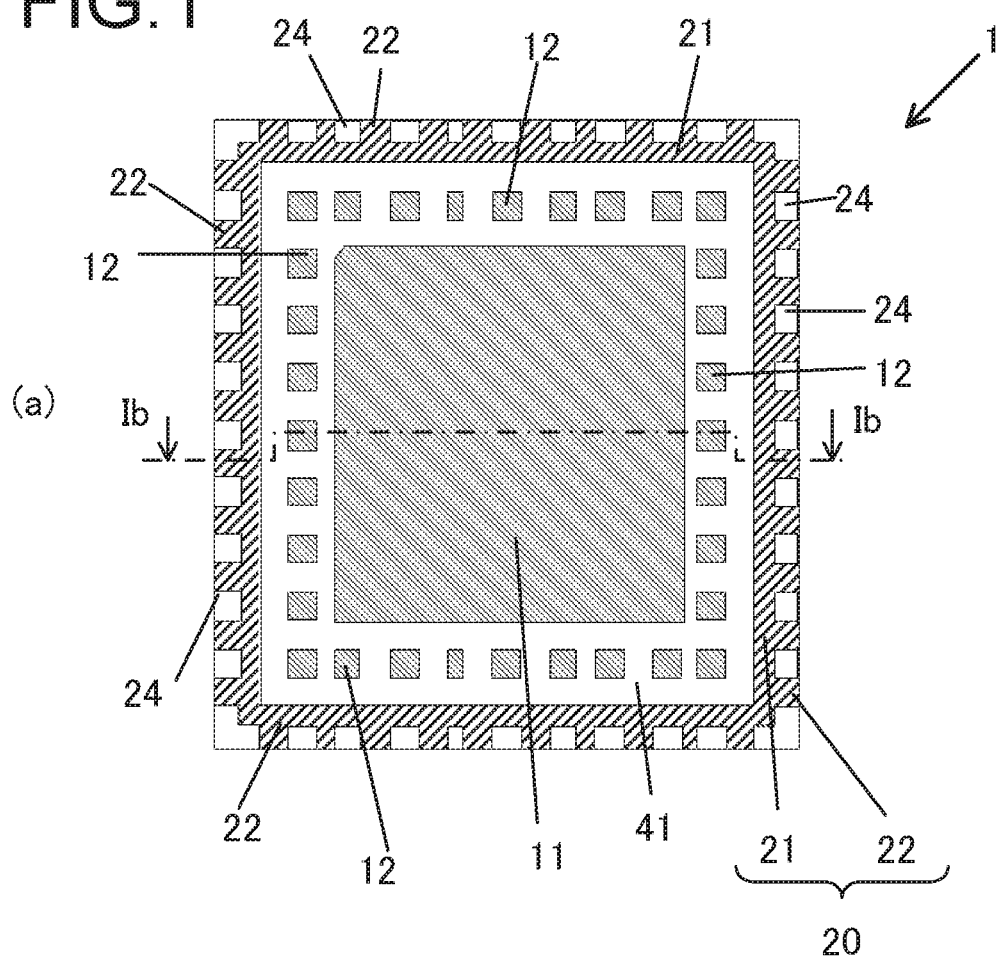
(a)
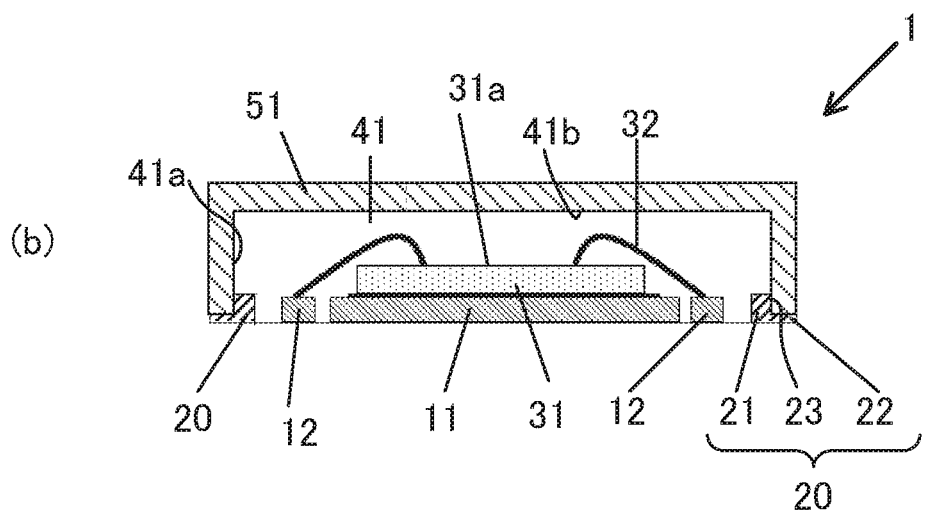
(b)

FIG.9
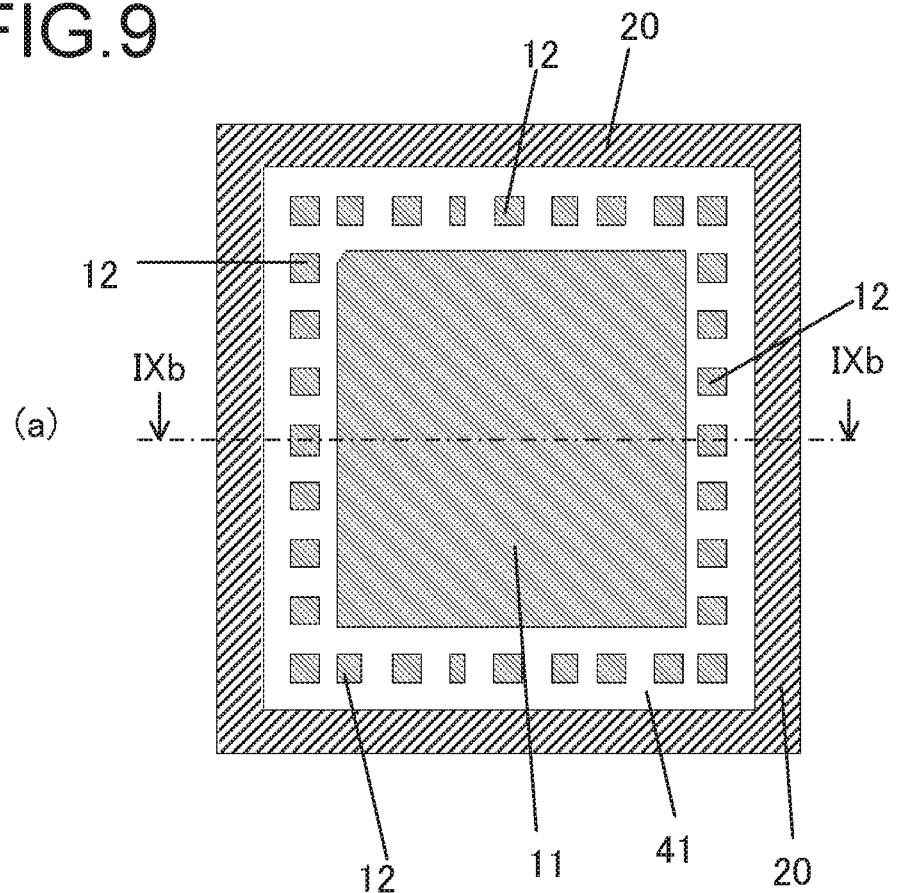
(a)
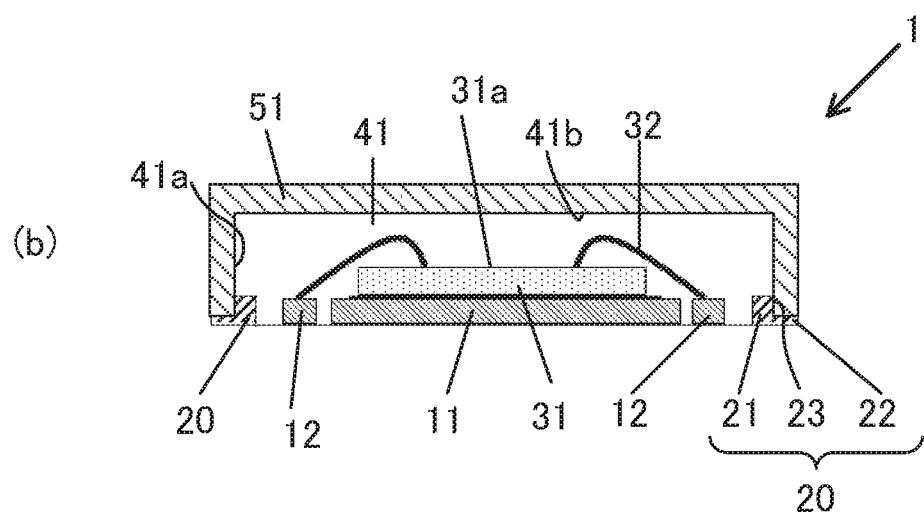
(b)

FIG.10
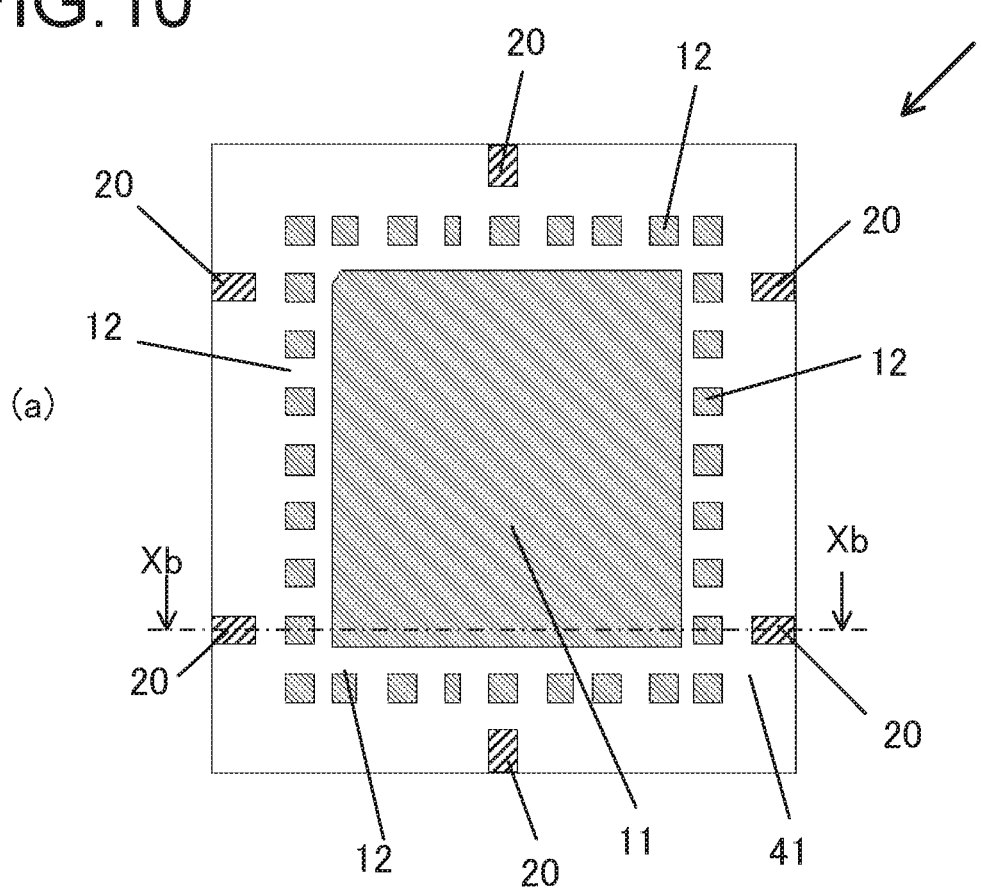
(a)
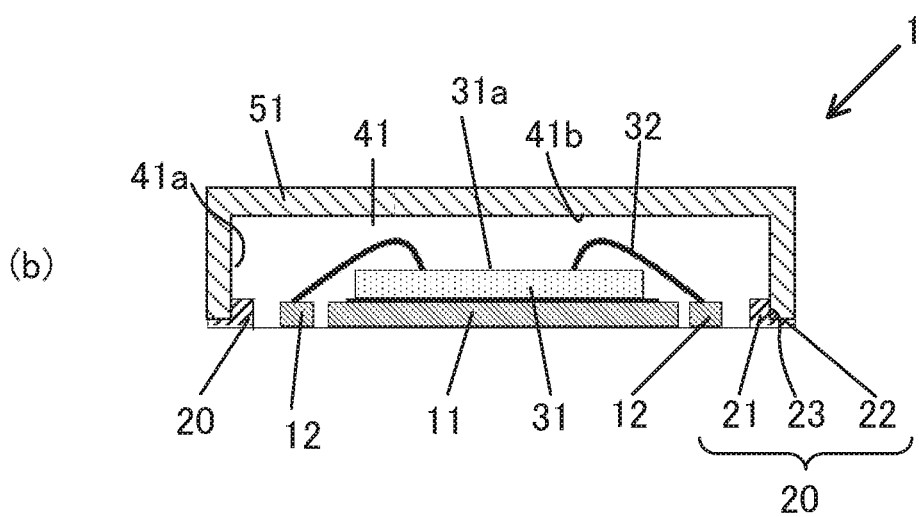
(b)

FIG.11
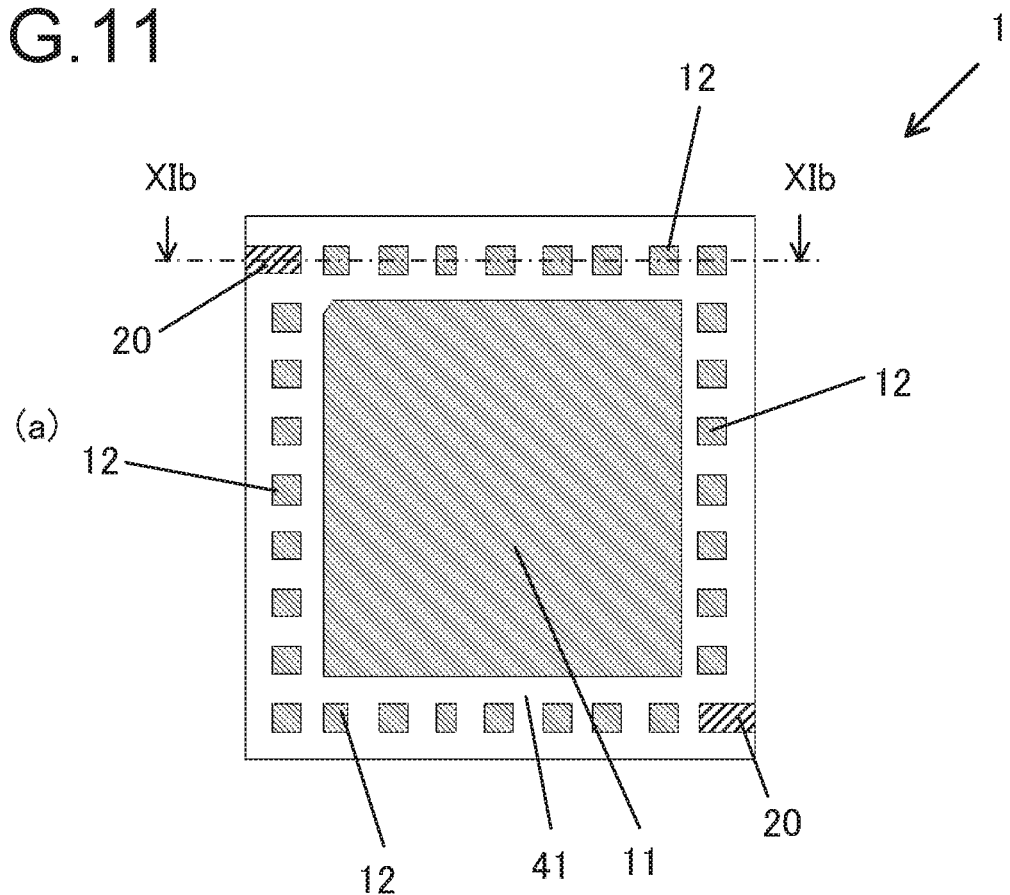
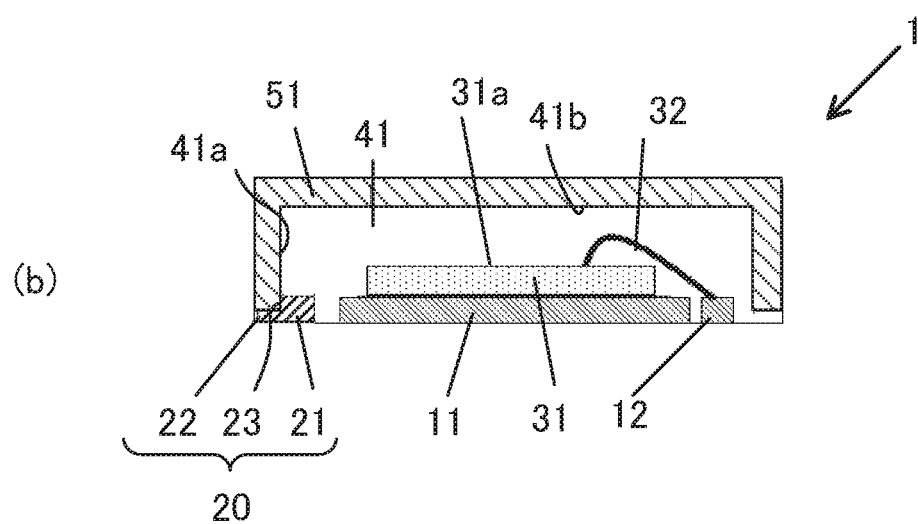

FIG.12
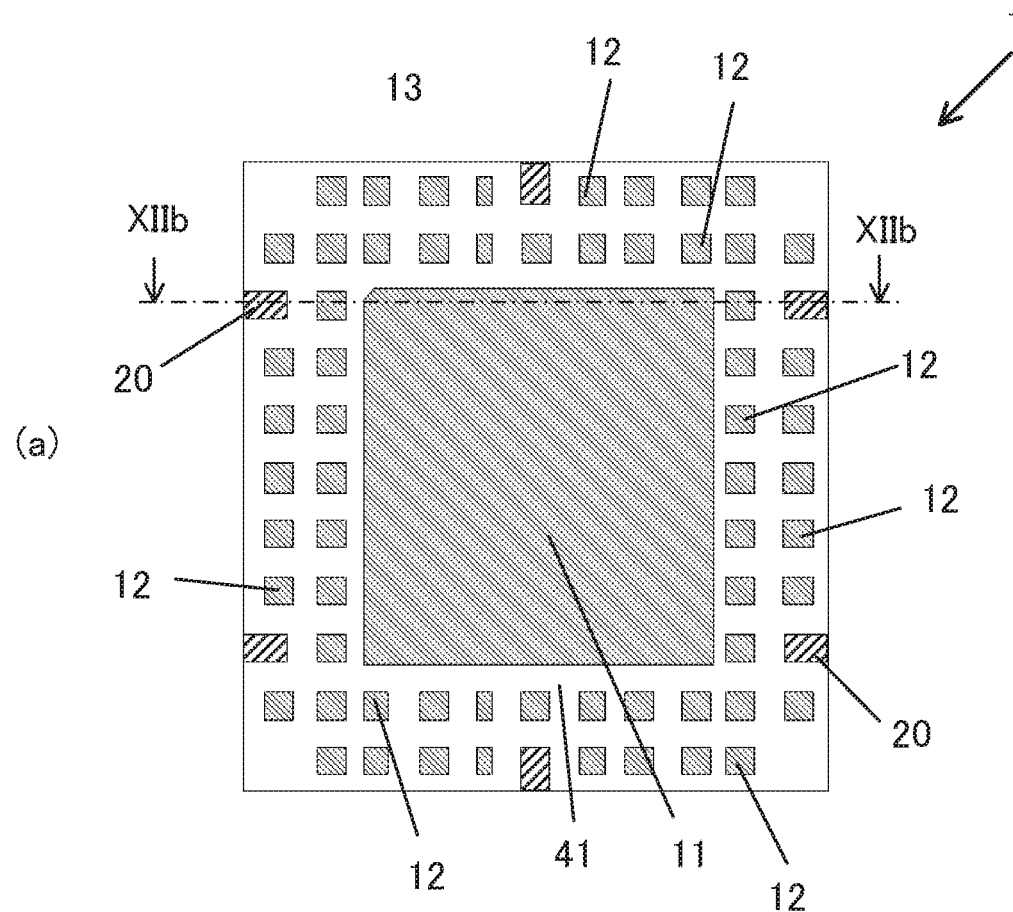
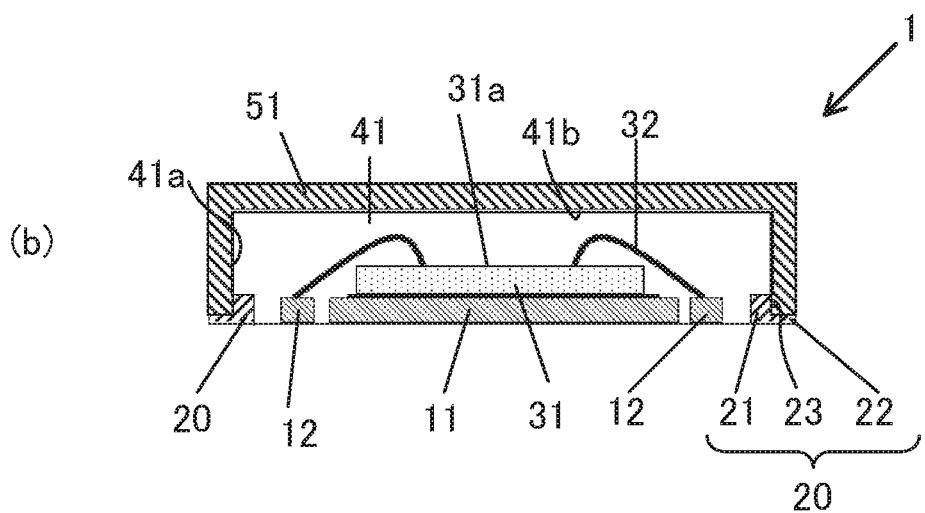

FIG.13
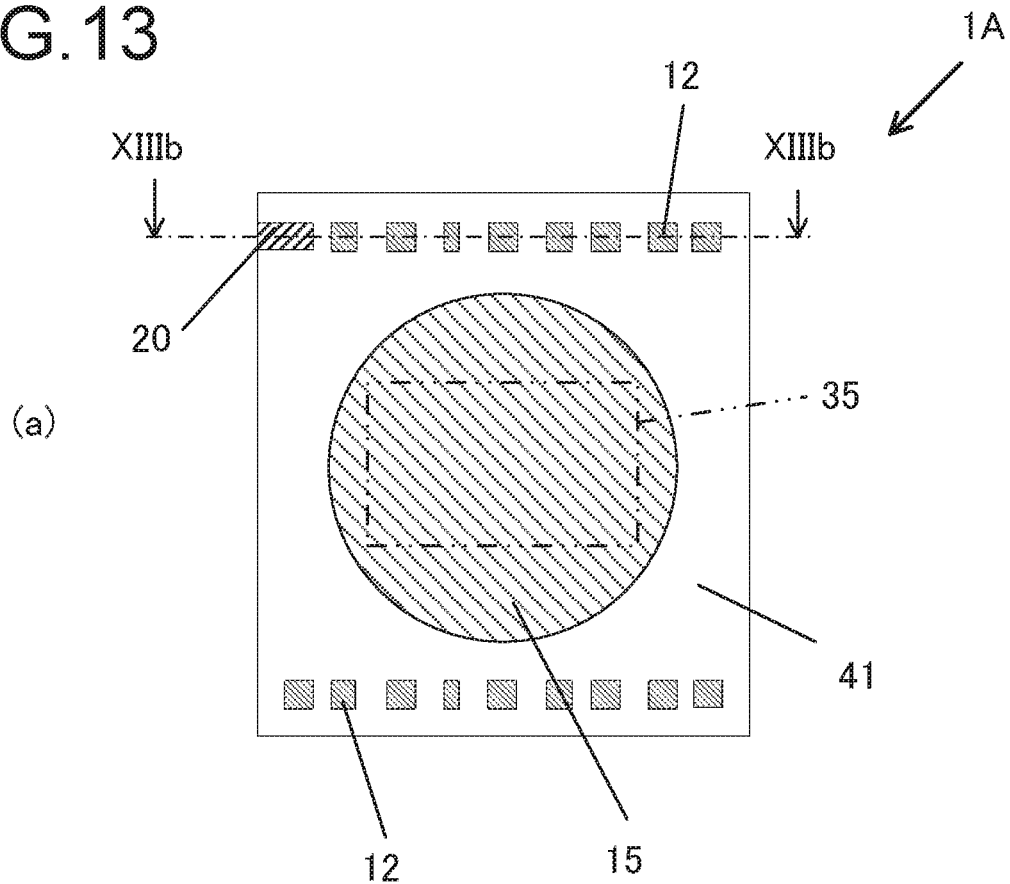
(a)
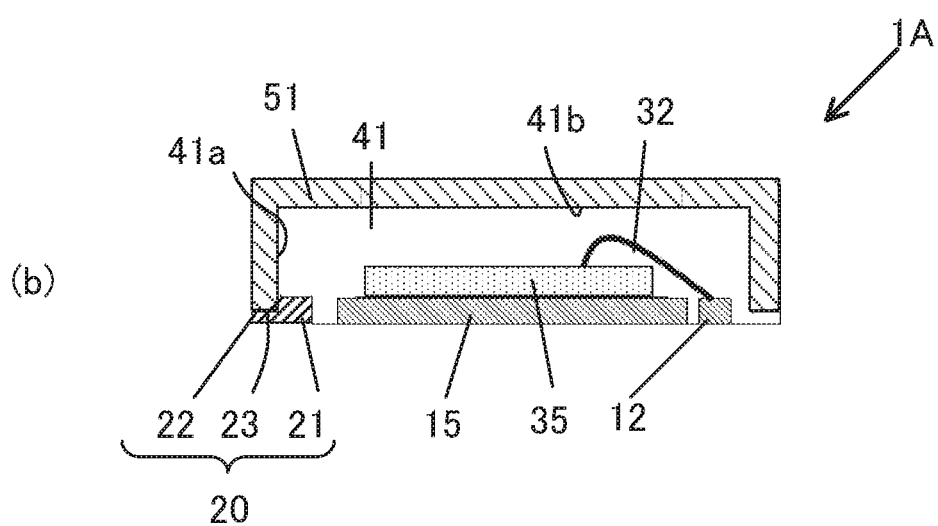
(b)

SEMICONDUCTOR DEVICE AND SEMICONDUCTOR DEVICE MANUFACTURING METHOD

CROSS REFERENCE TO RELATED APPLICATIONS

This application is a divisional of U.S. application Ser. No. 15/742,071, filed on Jan. 5, 2018, which is a National Stage of PCT/JP2016/064925, filed on May 19, 2016, which claims priority from Japanese Patent Application No. 2015-136216, filed on Jul. 7, 2015, the disclosure of which are expressly incorporated by reference herein.

TECHNICAL FIELD

The present invention relates to a semiconductor device and to a semiconductor device manufacturing method.

BACKGROUND ART

With a mobile electronic device such as a portable telephone, a smart phone, or the like, along with demands for making the device more compact, for making it thinner, and for increasing its functionality, also implementation of high density for components and sub-assemblies thereof is demanded. Due to this, sometimes erroneous operation is brought about due to the influence of mutual electromagnetic noise between these various sections. If a noise shielding structure for the electronic device is employed, then this makes the profile of the electronic device higher. Due to this, various manufacturing methods are per se known that provide a noise shielding function on the component level, or, to put it in another manner, that shield the various semiconductor devices on the component level. An example of this type of manufacturing method for a semiconductor device will now be described.

A mounting portion on which signal terminals, grounding terminals, and a semiconductor chip are mounted is formed upon a lead frame. The signal terminals and the grounding terminals are arranged alternatingly one at a time, so that they surround the periphery of the mounting portion. The signal terminals are formed to be thinner than the grounding terminals. The semiconductor chip is mounted upon the mounting portion, and electrodes of the semiconductor chip and the signal terminals are connected with bonding wires and are sealed with sealing resin. Portions of the sealing resin that correspond to the signal terminals and to the grounding terminals are removed by dicing. This dicing is performed so that all of the Sealing resin over the ground terminals is removed, while some of the sealing resin remains over the signal terminals. And electrically conductive paste is spread over the entire surface of the sealing resin.

This electrically conductive paste is electrically connected to the grounding terminals. However, since the signal terminals are formed to be thinner than the grounding terminals, accordingly the electrically conductive paste and the signal terminals are mutually insulated from one another. Subsequently, the signal terminals and the grounding terminals of the lead frame are cut along the edge surface of the electrically conductive paste on the external peripheral side (for example, refer to Patent Document #1).

CITATION LIST

Patent Literature

Patent Document #1: Japanese Laid-Open Patent Publication 2014-183142.

SUMMARY OF INVENTION

Technical Problem

With the semiconductor device of Patent Document #1, there is a possibility that noise interference via the signal terminals may occur.

Solution to Technical Problem

According to the 1st aspect of the present invention, a semiconductor device comprises: an island that is formed by a metallic layer including a single metallic layer or a plurality of different metallic layers; a semiconductor chip provided upon an upper surface of the island, and having a pair of side portions mutually opposing each other; a plurality of signal terminals disposed at an external periphery of at least the pair of side portions of the semiconductor chip, and formed by the metallic layer; a grounding terminal disposed at an external periphery of the plurality of signal terminals, and formed by the metallic layer; electrically conductive connection members that are connected between each of a plurality of electrodes of the semiconductor chip and each of the plurality of signal terminals; sealing resin that seals the island, the semiconductor chip, the electrically conductive connection members, the plurality of signal terminals, and the grounding terminal, so that a lower surface of the island, lower surfaces of the plurality of signal terminals, and a lower surface of the grounding terminal are exposed to the exterior; and a metallic shielding layer that covers over an outer peripheral side surface and an upper surface of the sealing resin, and a portion of the grounding terminal.

According to the 2nd aspect of the present invention, in the semiconductor device according to the 1st aspect, it is preferred that the plurality of signal terminals and the grounding terminal are formed from metallic foil or paste or by plating.

According to the 3rd aspect of the present invention, in the semiconductor device according to the 1st or 2nd aspect, it is preferred that the metallic shielding layer has at least one layer that is formed by vapor deposition, by spattering, or by plating.

According to the 4th aspect of the present invention, in the semiconductor device according to the 3rd aspect, it is preferred that the metallic shielding layer has a thickness of 0.1 to 20 μm.

According to the 5th aspect of the present invention, in the semiconductor device according to any one of the 1st through 4th aspects, it is preferred that: the semiconductor chip has a rectangular shape; the plurality of signal terminals are disposed along four sides of the semiconductor chip; and the grounding terminal is formed at the external periphery of the plurality of signal terminals, so as to surround the plurality of signal terminals.

According to the 6th aspect of the present invention, in the semiconductor device according to any one of the 1st through 5th aspects, it is preferred that: the grounding terminal is formed with a step, and has an inner peripheral portion and an outer peripheral portion that is thinner than the inner peripheral portion; and the metallic shielding layer is joined to an outer peripheral side surface of the step portion at a boundary between the inner peripheral portion and the outer peripheral portion.

According to the 7th aspect of the present invention, in the semiconductor device according to the 6th aspect, it is preferred that the outer peripheral side surface of the sealing resin is flush with the outer peripheral side surface of the step portion of the grounding terminal.

According to the 8th aspect of the present invention, in the semiconductor device according to the 6th aspect, it is preferred that in the outer peripheral portion of the grounding terminal, a plurality of separating portions are arrayed along the inner peripheral portion.

According to the 9th aspect of the present invention, in the semiconductor device according to the 8th aspect, it is preferred that the sealing resin is charged into each of the plurality of separating portions arrayed along the outer peripheral portion of the grounding terminal to have the same thickness as the outer peripheral portions.

According to the 10th aspect of the present invention, a semiconductor device manufacturing method, comprises: forming, upon an upper surface of a base member, an electronic component structure in which an island, signal terminals, and a grounding terminal disposed on an external peripheral side of the signal terminals are formed, a semiconductor chip is mounted upon an upper surface of the island, and electrodes of the semiconductor chip and the signal terminals are electrically connected together by electrically conductive connection members; sealing the electronic component structure with sealing resin; removing a portion of the sealing resin corresponding to at least a portion of the grounding terminal; covering a metallic shielding layer over an outer peripheral side surface of the shielding resin and at least the portion of the grounding terminal; and detaching the base member from the island, the signal terminals, the grounding terminal, and the sealing resin.

According to the 11th aspect of the present invention, in the semiconductor device manufacturing method according to the 10th aspect, it is preferred that the island, the signal terminals, and the grounding terminals are formed upon the base member by electroforming.

According to the 12th aspect of the present invention, in the semiconductor device manufacturing method according to the 10th or 11th aspect, it is preferred that: a when removing the portion of the sealing resin corresponding to at least the portion of the grounding terminal, an upper portion of the grounding terminal is removed so as to form a step portion on the grounding terminal; and when forming the metallic shielding layer upon at least the portion of the grounding terminal, the metallic shielding layer is formed upon at least a portion of the step portion of the grounding terminal.

According to the 13th aspect of the present invention, in the semiconductor device manufacturing method according to any one of the 10th through 12th aspects, it is preferred that: when forming the electronic component structure upon the base member, along with forming upon the base member a plurality of electronic structures adjacent to one another including a first electronic component structure and a second electronic component structure, also a first grounding terminal that is the grounding terminal of the first electronic component d a second grounding terminal that is the grounding terminal of the second electronic component structure, are integrated together; and after having detached the base member, the first grounding terminal and the second grounding terminal that were integrated together are further cut apart, and the first grounding terminal and the second grounding terminal are separated.

According to the 14th aspect of the present invention, in the semiconductor device manufacturing method according to the 10th aspect, it is preferred that after having detached the base member from the island, the signal terminals, the grounding terminal, and the sealing resin, further the island, the signal terminals, the grounding terminal, and the sealing resin covered by the metallic shielding layer are mounted upon dicing tape.

Advantageous Effects of Invention

Since, according to the present invention, the periphery around the signal terminals is covered over by the metallic shielding layer, therefore it is possible to suppress the generation of noise interference at the end surfaces of the signal terminals.

BRIEF DESCRIPTION OF DRAWINGS

FIG. 1 shows a first embodiment of the semiconductor device of the present invention: FIG. 1(a) is a plan view of the semiconductor device as seen from its lower surface, and FIG. 1(b) is a sectional view thereof taken along the lines Ib-Ib in FIG. 1(a);

FIG. 9 shows a second embodiment of the semiconductor device of the present invention: FIG. 9(a) is a plan view of the semiconductor device as seen from its lower surface, and FIG. 9(b) is a sectional view thereof taken along the lines IXb-IXb in FIG. 9(a);

FIG. 10 shows a third embodiment of the semiconductor device of the present invention: FIG. 10(a) is a plan view of the semiconductor device as seen from its lower surface, and FIG. 10(b) is a sectional view thereof taken along the lines Xb-Xb in FIG. 10(a);

FIG. 11 shows a fourth embodiment of the semiconductor device of the present invention: FIG. 11(a) is a plan view of the semiconductor device as seen from its lower surface, and FIG. 11(b) is a sectional view thereof taken along the lines XIb-XIb in FIG. 11(a);

FIG. 12 shows a fifth embodiment of the semiconductor device of the present invention: FIG. 12(a) is a plan view of the semiconductor device as seen from its lower surface, and FIG. 12(b) is a sectional view thereof taken along the lines XIIb-XIIb in FIG. 12(a); and FIG. 13 shows a sixth embodiment of the semiconductor device of the present invention: FIG. 13(a) is a plan view of the semiconductor device as seen from its lower surface, and FIG. 13(b) is a sectional view thereof taken along the lines XIIIb-XIIIb in FIG. 13(a).

DESCRIPTION OF EMBODIMENTS

Embodiment #1

The Semiconductor Device

Figure 2:
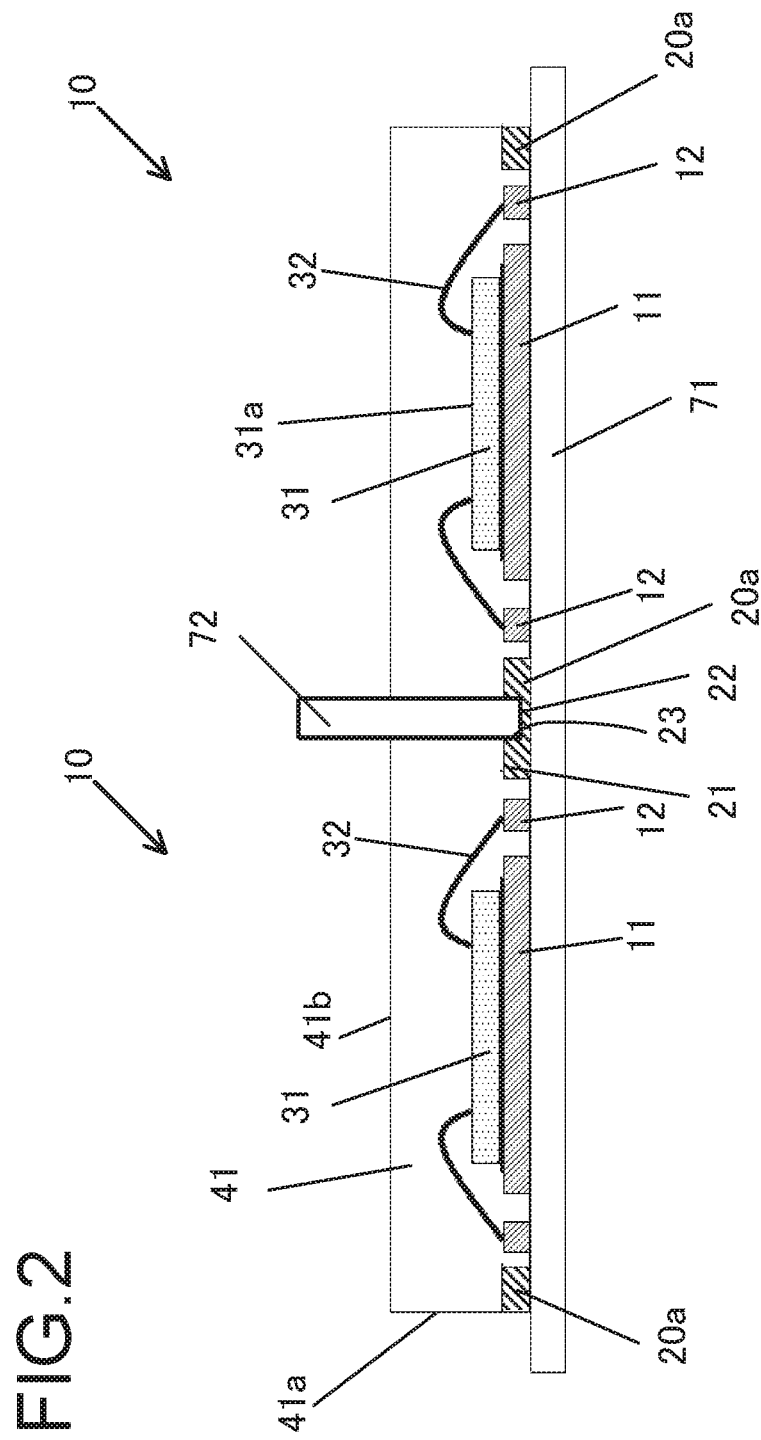
FIG. 2 is a figure for explanation of a method of manufacturing the semiconductor device shown in FIG. 1, and is a sectional view showing a first process.

A first embodiment of the semiconductor device of the present invention will now be explained with reference to FIG. 1. FIG. 1(a) is a plan view of the semiconductor device 1 as seen from its lower surface, while FIG. 1(b) is a sectional view thereof taken along lines Ib-Ib.

The semiconductor device 1 shown in FIG. 1 is one in which the present invention is applied to a semiconductor device of the so-called QFN (Quad Flat-pack No-leads) type. This semiconductor device 1 comprises an island 11, a plurality of signal terminals 12, a grounding terminal 20, a semiconductor chip 31, bonding wires 32, sealing resin 41, and a metallic shielding layer 51.

The island 11, the signal terminals 12, and the grounding terminal 20 are metallic layers that are made from metal foil or paste or by plating. The metal that is used for these may be gold, silver, palladium, nickel, copper, cobalt or the like. It would also be acceptable to arrange to form the signal terminals 12 and the grounding terminal 20 by laminating together metals that are mutually different. In other words, the island 11, the signal terminals 12, and the grounding terminal 20 may be formed as single layers, or as complex metallic layers that are made from a plurality of different metallic layers. In the case of a constriction in which the metallic layer is formed from a plurality of different metallic layers, if the bottommost layer is gold, then it is possible to ensure that the quality of joining is satisfactory when the semiconductor device 1 is fixed to the circuit substrate by re flow soldering or the like.

The semiconductor chip 31 has a rectangular shape, and a plurality of electrodes are arrayed upon the upper surface 31a of the semiconductor chip 31 along each of its four sides. This semiconductor chip 31 is die bonded to the upper surface of the island 11, whose shape is rectangular and is somewhat larger than the shape of the semiconductor chip 31. The signal terminals 12 are arrayed along the external periphery of the four sides of the semiconductor chip 31. The electrodes of the semiconductor chip 31 are electrically connected to the signal terminals 12 by bonding wires 32, Which are electrically conductive connection members. It should be understood that while, as one example, the signal terminals are here shown as being shaped in rectangular shapes, it would also be possible for them to be circular or to have some other shapes.

The grounding terminal 20 is formed as a square annulus that surrounds all of the signal terminals 12 on the external periphery of the signal terminals 12. This grounding terminal 20 comprises a relatively thick inner peripheral portion 21 and a thinner outer peripheral portion 22 whose thickness is less than that of the inner peripheral portion 21, thus being formed with a step. In other words, a step portion 23 is formed at the boundary between the inner peripheral portion 21 and the outer peripheral portion 22. The thickness of the inner peripheral portion 21 and the thicknesses of the signal terminals 12 are almost the same. Moreover, the outer peripheral portion 22 does not have a continuous square annular shape. Rather, as shown in FIG. 1(a), the outer peripheral portion 22 is provided around the external periphery of the inner peripheral portion 21, but with a plurality of predetermined gaps being opened in it. In other words, a plurality of separating portions 24 are arrayed along the outer peripheral portion 22.

The semiconductor chip 31, the bonding wires 32, the island 11, the signal terminals 12, and the inner peripheral portion 21 of the grounding terminal 20 are sealed by sealing resin 41. However, the lower surfaces of the island 11, the signal terminals 12, and the grounding terminal 20 are exposed to the exterior of the semiconductor device 1. A thermosetting type epoxy series resin may, for example, be used as the sealing resin 41.

The lower surfaces of the island 11, the signal terminals 12, and the grounding terminal 20 are upon almost the same plane as the lower surface of the sealing resin 41. And the outer peripheral side surface 41a of the sealing resin 41 becomes flush with the side surface of the step portion 23 of the grounding terminal 20, in other words with the side surface at the boundary between the outer peripheral portion 22 and the inner peripheral portion 21. Furthermore, at the lower portion of the semiconductor device 1, the sealing resin 41 is charged into the separating portions 24 of the outer peripheral portion 22. The thickness of these sealing resin 41 portions that are charged into the separating portions 24 of the outer peripheral portion 22 is the same as the thickness of the outer peripheral portion 22.

The metallic shielding layer 51 is formed as a layer upon the outer peripheral side surface 41a and the upper surface 41b of the sealing resin 41. This metallic shielding layer 51 may be formed by vapor deposition or spattering and/or by electroless plating. As one example, after having formed a thin metallic layer by vapor deposition or by spattering, a thick metallic layer may then be laminated thereupon by electro or electroless plating. By seeding the first thin metallic layer by vapor deposition or spattering, it is possible to perform the subsequent electroless plating processing at high efficiency.

The metallic shielding layer 51 is also formed upon the step portion 23 of the grounding terminal 20, in other words upon the side of the inner peripheral portion 21 at the boundary between the inner peripheral portion 21 and the outer peripheral portion 22. Due to this, it is possible to make the strength of the junction between the metallic shielding layer 51 and the grounding terminal 20 great, and it is thus possible to enhance the reliability of the electrical connection between them.

A First Manufacturing Method for this Semiconductor Device

An example of a first method for manufacturing the semiconductor device shown in FIG. 1 will now be explained with reference to FIGS. 2 through 4. As shown in FIG. 2, upon a base member 71 that is shaped as a thin plate, a plurality of electronic component structures 10 are formed so as to be mutually adjacent.

For example, stainless steel plate or the like may be used for the base member 71. The electronic component structures 10 do not yet possess any metallic shielding layers 51 such as the one of the semiconductor device 1 shown in FIG. 1. Each of the electronic component structures 10 comprises an island 11, a plurality of signal terminals 12, a grounding terminal 20a, a semiconductor chip 31, bonding wires 32, and sealing resin 41. For example, the island 11, the signal terminals 12, and the grounding terminal 20 may be formed upon the base member 71 by electroforming. The grounding terminal 20a is unified with and continuous with the grounding terminal 20a of an adjacent electronic component structure 10 to be formed in a wide shape. Moreover, the entire grounding terminal 20a is formed to be of the same thickness as the inner peripheral portion 21 shown in FIG. 1. It should be understood that although actually a large number of such electronic component structures 10 are formed adjacent to one another upon the base member 71, in the following description, for convenience of understanding, the explanation will be given in terms of just two of these electronic component structures having been formed.

The method for forming these electronic components structures 10 is as follows. It should be understood that, while each of the entire grounding terminals 20a has the same thickness, at the external periphery of each grounding terminal 20a, it is formed in the shape shown in FIG. 1, having the plurality of separating portions 24.

Next, the semiconductor chips 31 are die bonded upon the islands 11. And electrodes (not shown in the drawings) that are formed upon the upper surfaces 31a of the semiconductor chips 31 are electrically connected to the signal terminals 12 by the bonding wires 32.

Subsequently, the sealing resin mass 41 is formed by mold forming. This sealing resin 41 seals the semiconductor chips 31, the bonding wires 32, the islands 11, the signal terminals 12, and the grounding terminals 20a. The sealing resin 41 is formed so as to be continuous over the two adjacent electronic component structures 10, in other words so as to be integrated over them. To put it in another manner, the sealing resin 41 is formed so as to straddle over between the grounding terminals 20a of the two electronic component structures 10 thus being continuous over the two electronic component structures 10.

After having formed the plurality of electronic component structures 10 in which the sealing resin 41 has been formed integrally and continuously over the base member 71, as shown in FIG. 2, the sealing resin 41 over the grounding terminals 20a is then cut by using a dicing blade 72. Due to this, the sealing resin masses 41 for each of the electronic component structures 10 are separated. Moreover, the portion of the sealing resin 41 that correspond to the portion of the grounding terminals 20a at which the dicing blade 72 arrives while cutting the sealing resin 41 (i.e. the central portion between the two grounding terminals 20a in the widthwise direction comes to be eliminated. And then, by then shifting dicing blade 72 further downward, the grounding terminals 20a come to be half cut through. In other words, the upper portion of the central portion between the two grounding terminals 20a in the widthwise direction is eliminated. It should be understood that while, in FIG. 2, a state is shown in which the center between the two grounding terminals 20a is half cut through, actually both the left and right ends of the grounding terminals 20a are also half cut through. In other words, the dicing blade 72 is shifted in the back-and-forth direction and in the right-and-left direction, so that the central portions of the grounding terminals 20a in the widthwise direction (which are formed in the shape of rectangular frames) is half cut through. By half cutting through the grounding terminals 20a, the inner peripheral portions 21 and the outer peripheral portions 22 whose thickness is less than that of the inner peripheral portions 21 are formed. Moreover, the boundary portions between the inner peripheral portions 21 and the outer peripheral portions 22 are formed as the step portions 23.

When the outer peripheral portions 22 are formed by half cutting through the grounding terminals 20a, the portions of the sealing resin 41 that have been charged into the separating portions 24 (refer to FIG. 1) of the outer peripheral portions 22 come to be of the same thickness as the outer peripheral portions 22.

Figure 3:
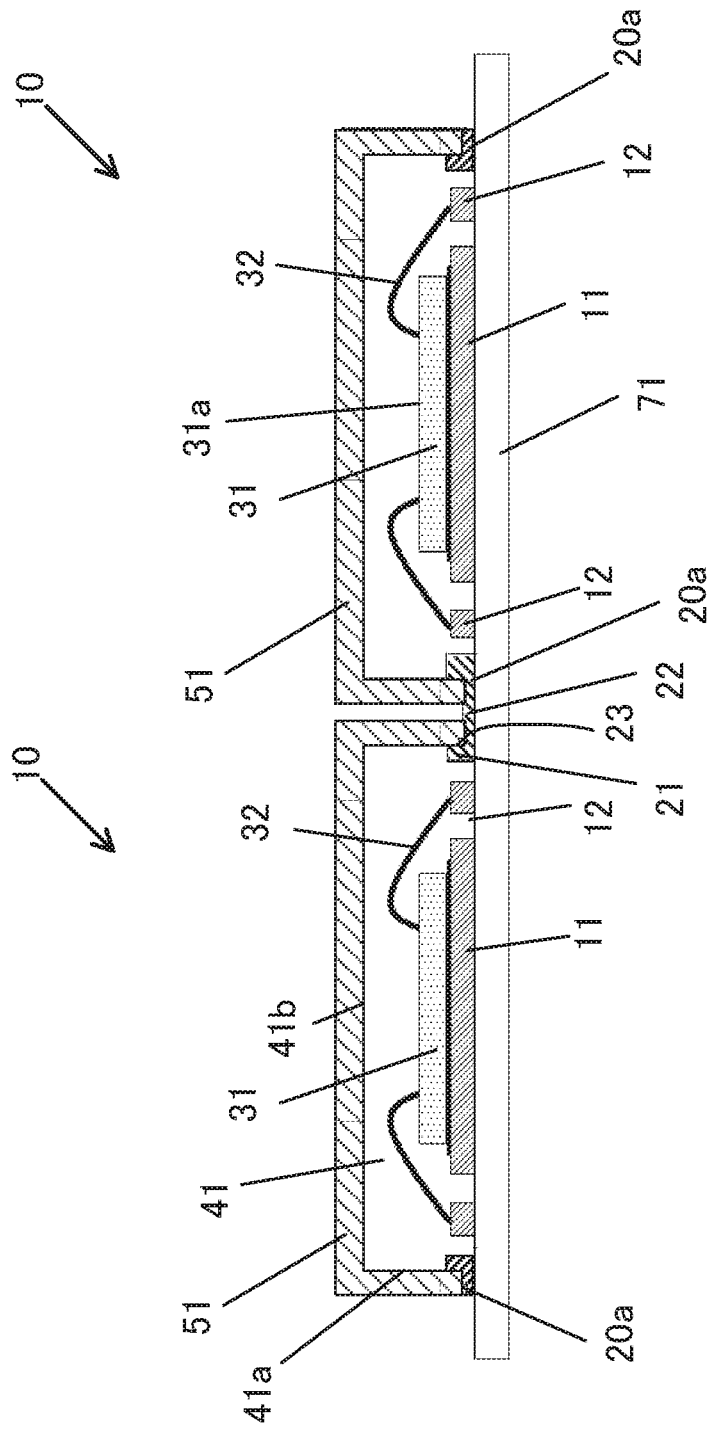
FIG. 3 is a sectional view for explanation of a process that continues on from FIG. 2.

Next, as shown in FIG. 3, metallic shielding layers 51 are formed as layers upon the outer peripheral side surfaces 41a and upon the upper surfaces 41b of the sealing resin masses 41 of the respective electronic component structures 10. In order to deposit these metallic shielding layers 51, a method may be employed of, after having formed thin layers by vapor deposition or by spattering, subsequently forming a thick coating by electroless plating. It would also be acceptable to arrange to form the metallic shielding layers 51 by performing plating directly upon the outer peripheral side surfaces 41a and upon the upper surfaces 41b of the sealing resin masses 41. The thickness of the thin layer that is formed by vapor deposition or by spattering may, for example, be around 0.1 to 5.0 μm. And the thickness of the thicker coating that is formed by electroless plating may, for example, be around 0.1 to 20 μm.

The metallic shielding layers 51 are also formed upon the step portions 23 of the grounding terminals 20a, in other words upon the side surfaces of the boundaries between the inner peripheral portions 21 and the outer peripheral portions 22. Moreover, the metallic shielding layers 51 are also formed upon the upper surfaces of the outer peripheral portions of the grounding terminals 20a. Due to this, it is possible to make the strength of the junctions between the metallic shielding layers 51 and the grounding terminals 20a great.

Figure 4:
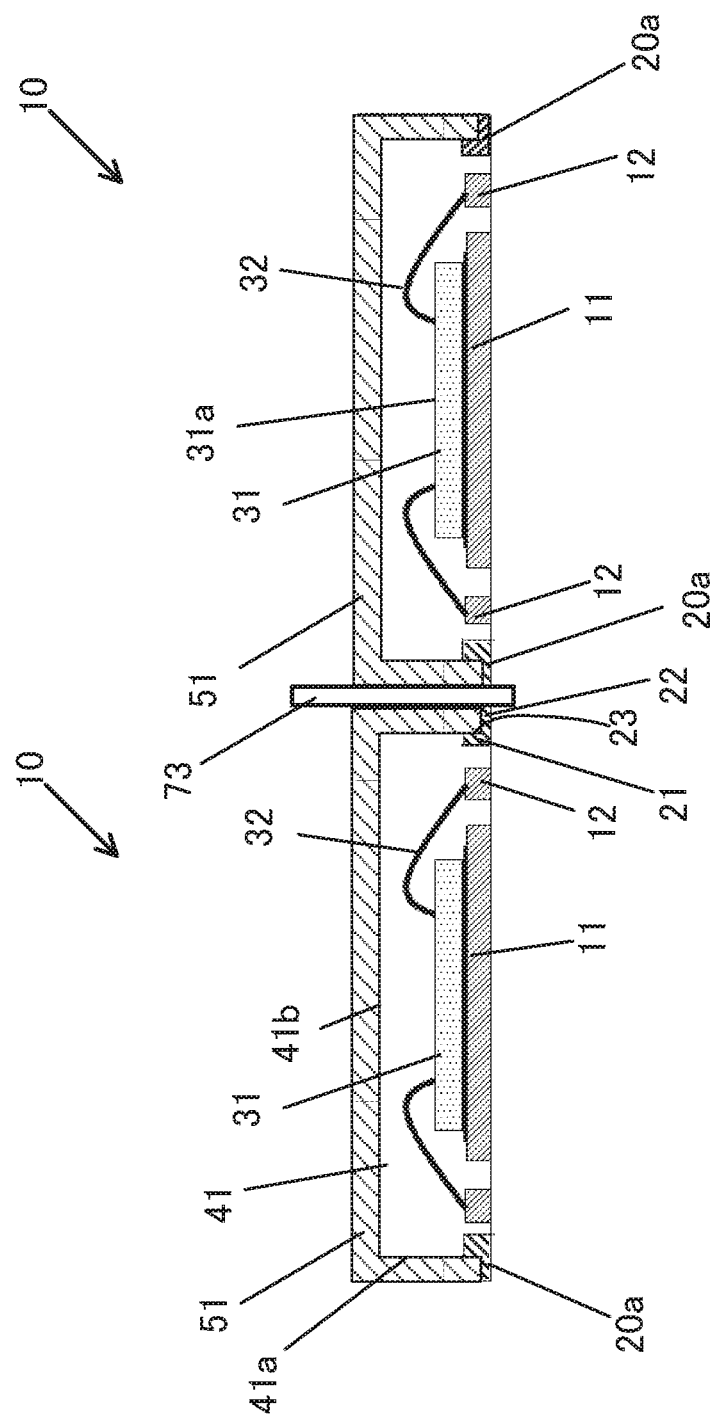
FIG. 4 is a sectional view for explanation of a process that continues on from FIG. 3.

And then, as shown in FIG. 4, the base member 71 is detached from the islands 11, the signal terminals 12, the grounding terminals 20a, and the sealing resin masses 41. Subsequently, the grounding terminals 20a are cut apart with a dicing blade 73 at the centers of their outer peripheral portions 22. This cutting apart of the grounding terminals 20a is also performed along all the four sides of each of the grounding terminals 20a, which are formed in the shape of rectangular frames. By cutting the whole circumference of each of the grounding terminals 20a, the electronic component structures 10 are separated along with the metallic shielding layers that have been formed upon their upper surfaces 41b, and thereby a plurality of the e semiconductor devices 1 shown in FIG. 1 are obtained.

With the semiconductor device 1 according to the first embodiment described above, the following advantageous effects are obtained.

(1) The grounding terminal 20 is disposed around the external periphery of the plurality of signal terminals 12 that are connected to the electrodes of the semiconductor chip 31. And the signal terminals 12 and the grounding terminal 20 are sealed with the sealing resin 41, except for their lower surfaces. Moreover, the metallic shielding layer 51 is formed upon the outer peripheral side surface 41a and upon the upper surface 41b of the sealing resin 41. With this construction, the end surfaces of the signal terminals 12 at their external periphery are covered over by the metallic shielding layer 51, and are not exposed. Due to this, it is possible to suppress the occurrence of noise interference to the signal terminals 12.

(2) The island 11, the signal terminals 12, and the grounding terminal 20 are made by electroforming. Due to this, the thickness of the terminals becomes very thin, and it can be expected that the profile of the semiconductor device 1 will be lowered.

(3) The metallic shielding layer 51 is formed as a coating over the sealing resin 41 by vapor deposition or by spattering, and by electroless plating. Due to this, the thickness of the metallic shielding layer 51 becomes very thin, and it can be expected that the profile of the semiconductor device 1 will be lowered.

(4) The grounding terminal 20 has the described construction in which the inner peripheral portion 21 and the outer peripheral portion 22 whose thickness is less than that of this inner peripheral portion 21, and the step portions 23 are formed at the boundary between the inner peripheral portion 21 and the outer peripheral portion 22. Due to this, it is possible also to form the metallic shielding layer 51 at these step portions 23 of the grounding terminal 20, and it is possible to make the strength of the junction between the metallic shielding layer 51 and the grounding terminal 20 high, so that the reliability of the electrical connection between them can be enhanced.

(5) The outer peripheral portion 22 of the grounding terminal 20 does not have a continuous square annular shape, but rather has the shown construction in which the plurality of separating portions 24 are arrayed to provide predetermined gaps. Due to this, it is possible to reduce the load that is applied to the grounding terminals 20a when the thin outer peripheral portions 22 are formed by half cutting through the grounding terminals 20a, as shown in FIG. 2. And, because of this, when forming the outer peripheral portions 22, it is possible to prevent deterioration of the grounding terminals 20a and damage thereto.

(6) in the manufacturing method for this semiconductor device 1, after having sealed the semiconductor chip 31 and so on with the sealing resin 41, it is arranged to cut the sealing resin 41, and to cut halfway through the grounding terminals 20a. In other words, the processing for making the outer peripheral portions 22 of the grounding terminals 20a thin, and the processing for separating the sealing resin masses 41 for each of the electronic component structures 10, can be performed simultaneously by the same action. Due to this, it is possible to enhance the efficiency of working, as compared to a method in which, after having formed the outer peripheral portion 22 by reducing the thickness of the grounding terminal 20a, subsequently the sealing with the sealing resin 41 is performed.

A Second Manufacturing Method for this Semiconductor Device

It is also possible to ploy a different manufacturing method for manufacturing the semiconductor device 1. An example of this second manufacturing method for a semiconductor device will now be explained with reference to FIGS. 5 through 8. This method that is explained below is a preferable manufacturing method in the case of a construction in which the semiconductor device is not to be formed with a thin outer peripheral portion 22 upon its grounding terminal 20.

In a similar manner to the case with the first manufacturing method, a plurality of electronic component structures 10 are manufactured upon the base member 71 which is a stainless steel plate or the like, and all of these electronic component structures 10 are sealed with the sealing resin 41 by molding. This state is shown in FIG. 5.

Figure 5:
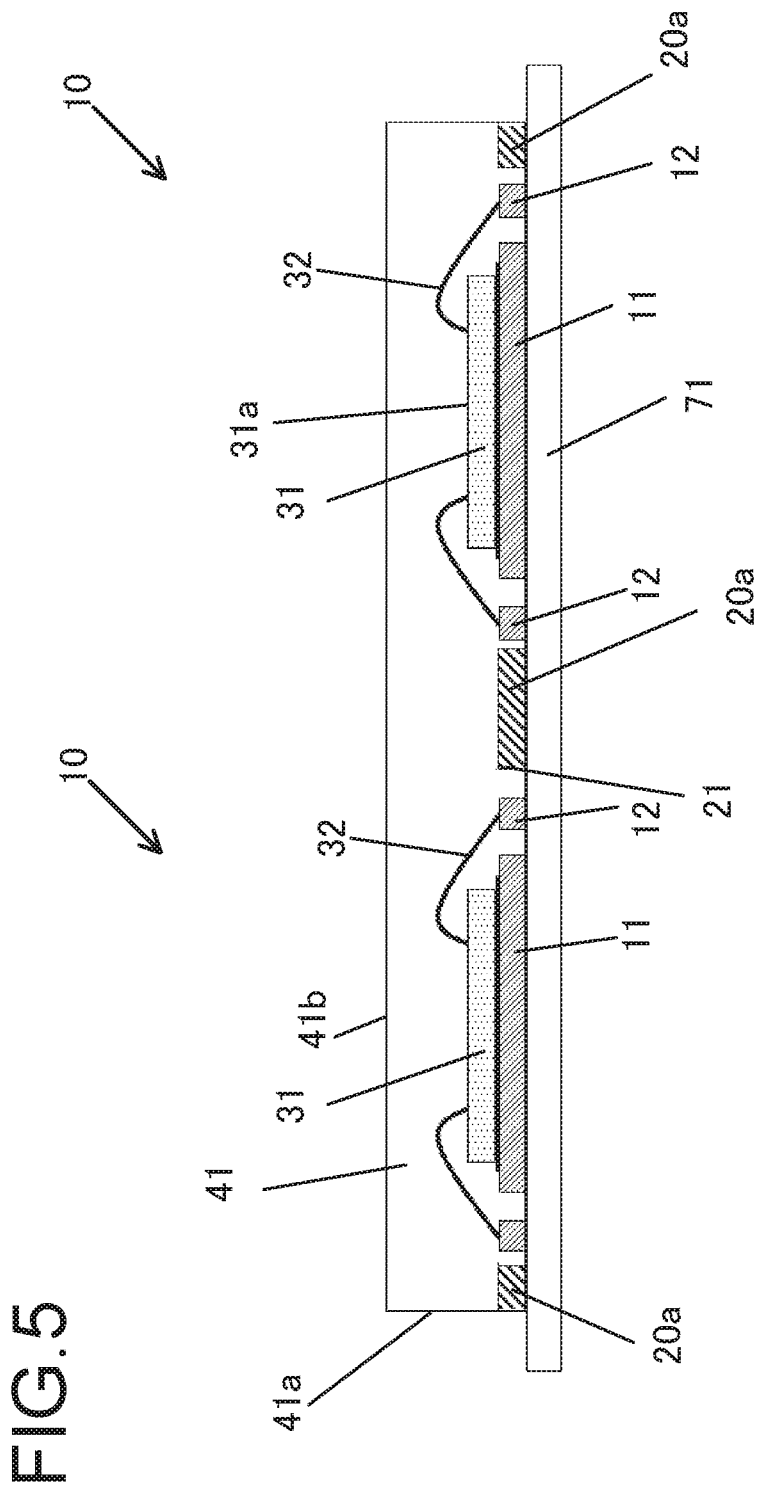
FIG. 5 is a figure for explanation of another method of manufacturing the semiconductor device of the present invention, and is a sectional view showing a first process.
Figure 6:
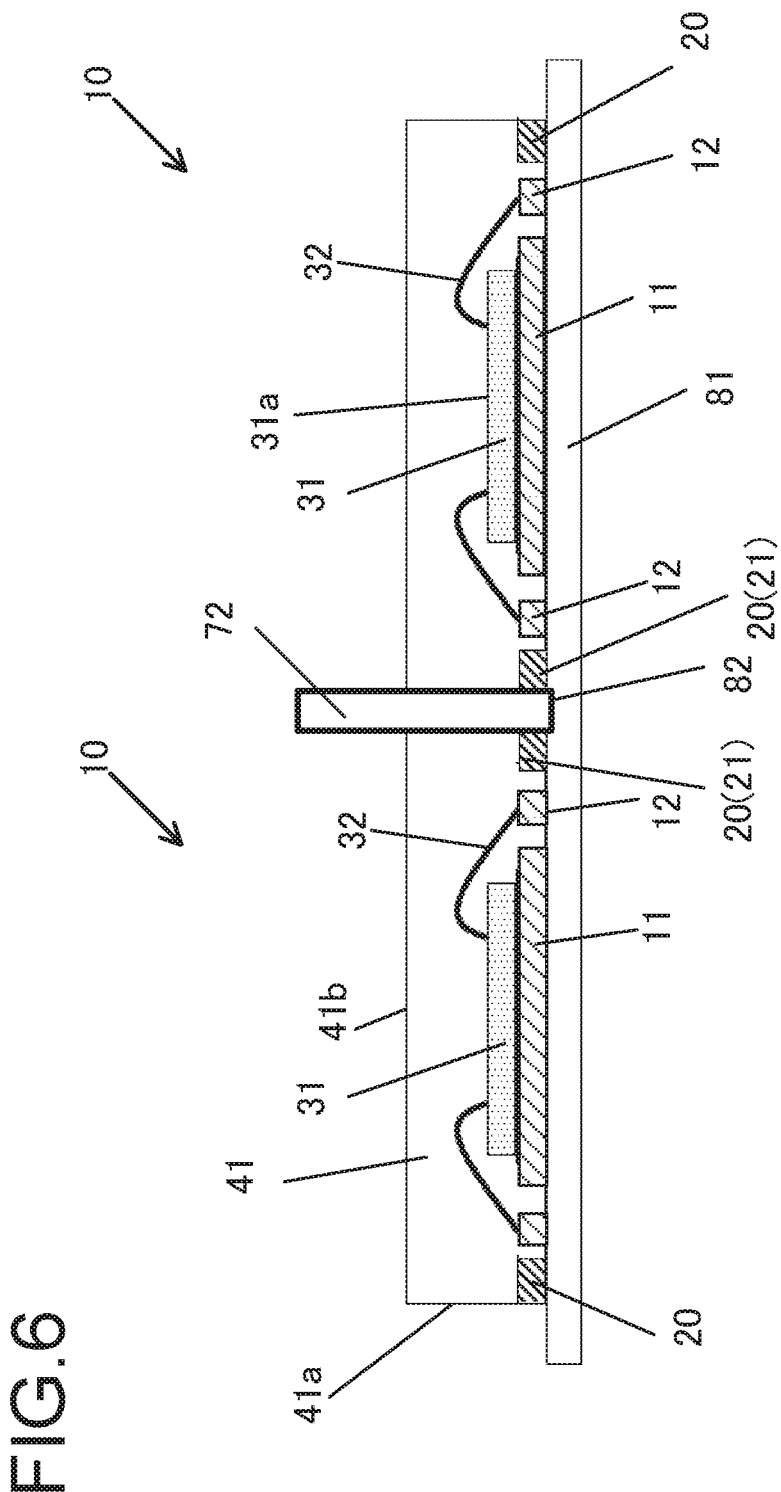
FIG. 6 is a sectional view for explanation of a process that continues on from FIG. 5.

In the state of FIG. 5, the electronic component structures that have been sealed with the sealing resin 41 are detached from the base member 71. And the electronic component structures that have been sealed with the sealing resin 41 are then adhered upon dicing tape 81, which thus constitutes a second base member. This dicing tape 81 is a standard type of dicing tape that is suitable for UV irradiation or for plating. In this state, the sealing resin 41 above the grounding terminals 20a is cut through by using a dicing blade 72. By doing this, the sealing resin masses 41 for each of the electronic component structures are separated. This process in which the electronic component structures 10 are also separated along with the sealing resin 41 differs from the case with the first manufacturing method, by the feature that it is performed in such a manner that the upper surface of the dicing tape 81 is removed by the dicing blade 72. Due to this, groove portions 82 are formed where the upper surface of the dicing tape 81 has been removed by the dicing blade 72. Accordingly, in the grounding terminal 20a, the outer peripheral portion 22 is cut away, so that the grounding terminal 20 consists only of the inner peripheral portion 21. This state is shown in FIG. 6.

Figure 7:
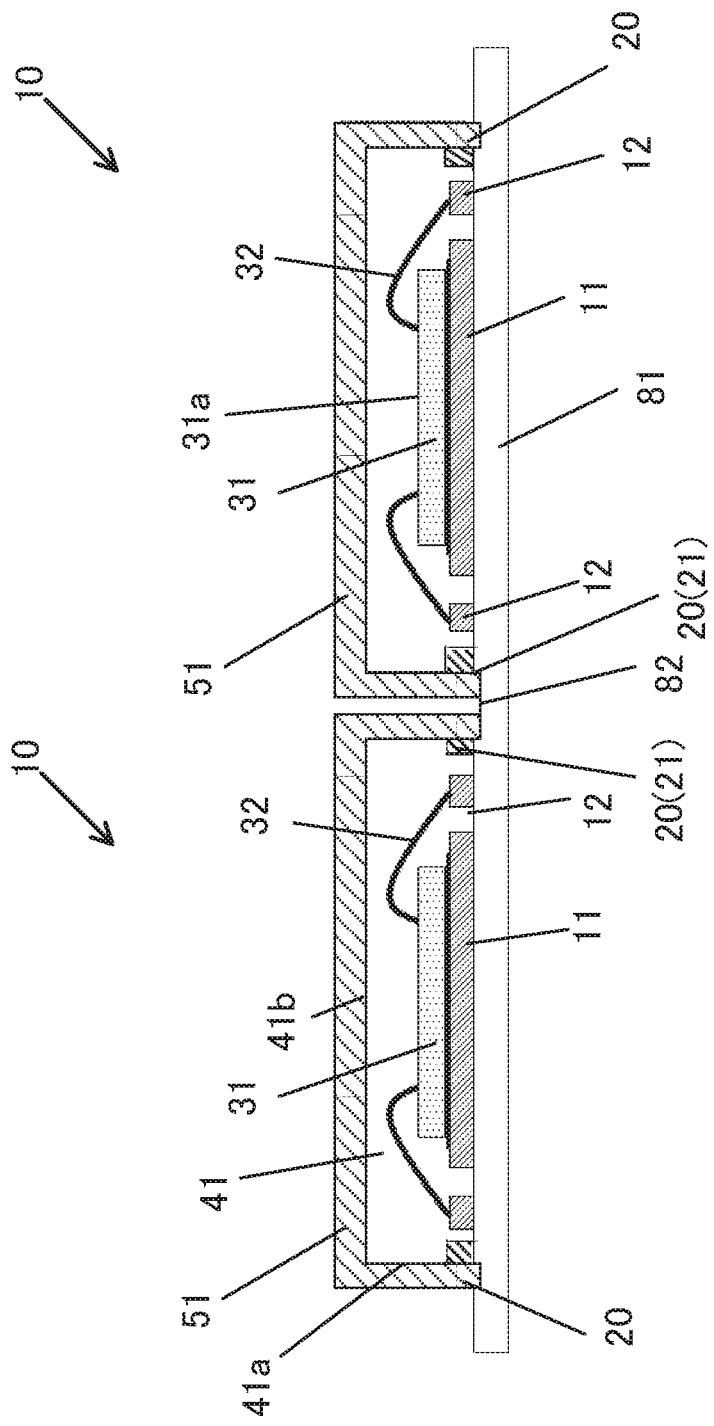
FIG. 7 is a sectional view for explanation of a process that continues on from FIG. 6.

Next, as shown in FIG. 7, in a similar manner to the case with the first manufacturing method, the metallic shielding layers 51 are formed upon the outer peripheral side surfaces 41a and upon the upper surfaces 41b of the sealing resin masses 41 of the electronic component structures 10.

Figure 8:
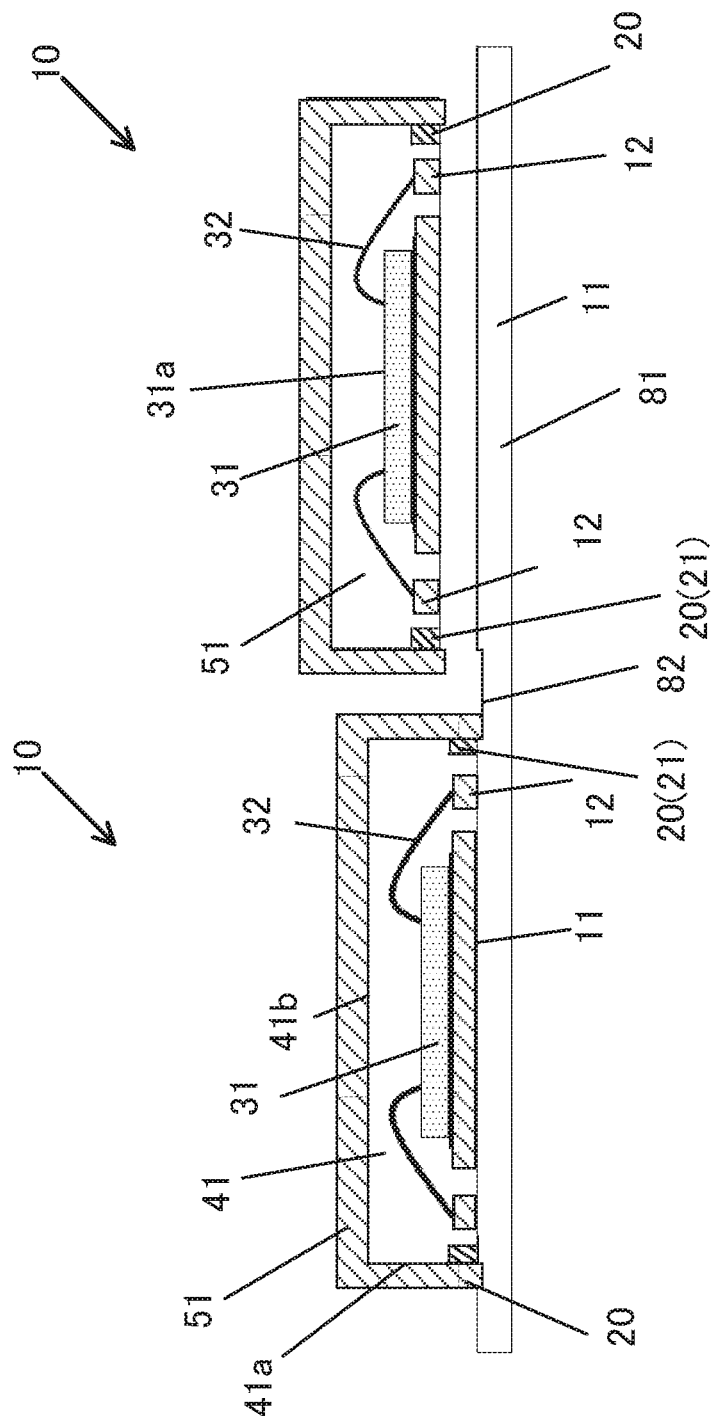
FIG. 8 is a sectional view for explanation of a process that continues on from FIG. 7.

And, as shown in FIG. 8, the electronic component structures 10 upon which the metallic shielding layers 51 have been formed over sealing resin 41 are picked up from the dicing tape 81. The states both before pickup and also after pickup are shown in FIG. 8.

As compared with the first manufacturing method for this semiconductor device, in this second manufacturing method, the process is added of moving the electronic component structures 10 that have been sealed by the sealing resin masses 41 from the base member 71, which is a stainless steel plate or the like, onto the dicing tape 82, which thus serves as a second base member. However, in the process of cutting through the sealing resin 41 over the grounding terminals 20a by using the dicing blade 72, it is possible to cut away just the upper surface of the dicing tape 82 with the dicing blade 72. When this is done, accuracy for the adjustment of the height position of the dicing blade 72 is not required, so that it becomes possible to cut through the sealing resin 41 over the grounding terminals 20a very efficiently.

Embodiment #2

FIG. 9 shows a second embodiment of the semiconductor device of the present invention: FIG. 9(a) is a plan view of the semiconductor device as seen from its lower surface, and FIG. 9(b) is a sectional view thereof taken along the lines IXb-IXb in FIG. 9(a).

With the semiconductor device 1 shown in FIG. 9, the outer peripheral portion 22 of the grounding terminal 20 has a continuous square annular shape. To put it in another manner, with this semiconductor device of the second embodiment, the outer peripheral portion 22 of the grounding terminal 20 is formed as a continuous square annulus, and does not have any separating portions 24 such as those of the semiconductor device of the first embodiment shown in FIG. 1.

This construction according to the second embodiment may be applied if it is ensured that no deterioration or damage to the grounding terminal takes place when the grounding terminals are half cut so that the outer peripheral portions 22 that are thin are formed.

The other structures of this second embodiment are the same as corresponding ones of the first embodiment, and the same reference symbols are appended to corresponding elements, with explanation thereof being omitted. This semiconductor device 1 according to the second embodiment also can be manufactured in a similar manner to the first embodiment.

Accordingly, with this second embodiment as well, it is possible to obtain the advantageous effects (1) through (4) and (6) of the first embodiment. Moreover, according to this second embodiment, it is possible to enhance the advantageous effect of suppression of noise interference at the signal terminals 12 by yet a further level.

Embodiment #3

FIG. 10 shows a third embodiment of the semiconductor device of the present invention: FIG. 10(*a*) is a plan view of the semiconductor device as seen from its lower surface, and FIG. 10(*b*) is a sectional view thereof taken along the lines Xb-Xb in FIG. 10(*a*).

With the semiconductor device 1 shown in FIG. 10, the grounding terminal 20 does not have a square annular shape. Rather, this grounding terminal 20 comprises a plurality of portions at the external periphery of the signal terminals 12 arranged so as to be mutually spaced apart from one another. In the example of the grounding terminal 20 shown in FIG. 10, two of these portions are provided to each of a pair of the left and right side edges of the set of signal terminals 12, and similarly one of these portions are provided to each of a pair of the top and bottom side edges of the set of signal terminals 12.

The other structures of this third embodiment are the same as corresponding ones of the first embodiment, and the same reference symbols are appended to corresponding elements, with explanation thereof being omitted. Moreover, this semiconductor device 1 according to the third embodiment can be manufactured in a similar manner to the first embodiment.

In this third embodiment as well, each of the grounding terminals 20 is joined to the metallic shielding layer 51 that is coated upon the outer peripheral side surface 41*a* and the upper surface 41*b* of the sealing resin 41. Due to this, the end surfaces of the signal terminals 12 at their external periphery are covered over by the metallic shielding layer 51. Accordingly, with this third embodiment as well, it is possible to obtain the advantageous effects (1) through (4) and (6) of the first embodiment.

Embodiment #4

FIG. 11 shows a fourth embodiment of the semiconductor device of the present invention: FIG. 11(*a*) is a plan view of the semiconductor device as seen from its lower surface, and FIG. 11(*b*) is a sectional view thereof taken along the lines XIb-XIb in FIG. 11(*a*).

This fourth embodiment shows an example in which the number of portions of the grounding terminal 20 is further reduced. With the semiconductor device 1 of this fourth embodiment, the grounding terminal 20 is formed as only two portions, and these are arranged as a pair upon a single diagonal line. In FIG. 10, the end surfaces of the grounding terminal portions 20 at the outer peripheral side are located upon the left and right sides. However, it would also be acceptable to arrange for these end surfaces of the grounding terminal portions 20 at the outer peripheral side to be located at the top and bottom sides.

The other structures of this fourth embodiment are the same as corresponding ones of the first embodiment, and the same reference symbols are appended to corresponding elements, with explanation thereof being omitted. This semiconductor device 1 according to the fourth embodiment can also be manufactured in a similar manner to the first embodiment.

Accordingly, with this fourth embodiment as well, it is possible to obtain the advantageous effects (1) through (4) and (6) of the first embodiment.

Embodiment #5

FIG. 12 shows a fifth embodiment of the semiconductor device of the present invention: FIG. 12(*a*) is a plan view of the semiconductor device as seen from its lower surface, and FIG. 12(*b*) is a sectional view thereof taken along the lines XIIb-XIIb in FIG. 12(*a*).

With this semiconductor device 1 according to the fifth embodiment, the feature that the signal terminals 12 have a configuration in which they are positioned in two square annuli in sequence around the external periphery of the semiconductor chip 31 is different from the case with the fourth embodiment. That is to say, among the signal terminals 12 that are formed in two square annuli, one around the internal periphery and one around the external periphery, some of the signal terminals 12 around the external periphery (in this embodiment, six thereof) are endowed the function of acting as the grounding terminal 20. With this structure, among the signal terminals 12 around the external periphery, those that are surplus to requirements, or, to put it in another manner, the ones thereof that are not needed for use as signal terminals 12, can be used for providing the function of the grounding terminal 20.

The other structures of this fifth embodiment are the same as corresponding ones of the fourth embodiment, and the same reference symbols are appended to corresponding elements, with explanation thereof being omitted. This semiconductor device 1 according to the fifth embodiment can also be manufactured in a similar manner to the first embodiment.

With this fifth embodiment as well, it is possible to obtain the same advantageous effects as with the fourth embodiment.

It should be understood that, in FIG. 12, an example is shown in which the signal terminals 12 are arranged in two square annuli, in sequence around the external periphery of the semiconductor chip 31. However, it would also be possible for the signal terminals 12 to be arranged in three or more square annuli, in sequence around the external periphery of the semiconductor chip 31.

Embodiment #6

FIG. 13 shows a sixth embodiment of the semiconductor device of the present invention: FIG. 13(*a*) is a plan view of the semiconductor device as seen from its lower surface, and FIG. 13(*b*) is a sectional view thereof taken along the lines XIIIb-XIIIb in FIG. 13(*a*).

The semiconductor device 1A shown in FIG. 13 is a case in which the present invention has been applied to a so-called DFN (Dual Flat-pack No-Lead) semiconductor device.

The semiconductor device 1A comprises an island 15, a plurality of signal terminals 12, a grounding terminal 20, a semiconductor chip 35, bonding wires 32, sealing resin 41, and a metallic shielding layer 51. The island 15 has a circular shape. This semiconductor device 1A is a DFP (Dual Flat Package), and its electrodes (not shown in the drawings) are arrayed in two rows along only one pair of its long edges. The semiconductor device 1A is die bonded to the circular island 15. It should be understood that, in FIG. 13(*a*), the semiconductor chip 35 is shown by a double dotted broken line.

The signal terminals 12 are arrayed in two mutually opposing rows along the long sides of the semiconductor chip 35, in other words along the same directions as those in which the electrodes are arrayed. And the grounding terminal 20 is provided at one end portion of one of these rows of signal terminals 12.

The other structures of the semiconductor device 1A of this sixth embodiment are the same as corresponding ones of the first through the fifth embodiments. In other words, the grounding terminal 20 has an inner peripheral portion 21, an outer peripheral portion 22, and a step portion 23. The step portion 23 of the grounding terminal 20 is joined to the metallic shielding layer 51, which covers over the outer peripheral side surface 41a and the upper surface 41b of the sealing resin 41. Due to this, the end surfaces of the signal terminals 12 on their external peripheral sides are covered over by the metallic shielding layer 51. Accordingly, with this sixth embodiment as well, it is possible to obtain the advantageous effects (1) through (4) and (6) of the first embodiment.

It should be understood that, instead of QFN semiconductor chips 31, it would also be possible to apply DFN semiconductor chips 35 to the semiconductor devices 1 of the first through the fifth embodiments. In this case, the signal terminals 12 may be arrayed in two rows along the arrays of electrodes of the semiconductor chips 35.

Moreover, the first through the sixth embodiments may be selectively combined.

In the various embodiments described above, constructions were shown by way of example in which the step portion 23 of the grounding terminal 20 was made to be flush with the outer peripheral side surface 41a of the sealing resin 41. However, the step portion 23 of the grounding terminal 20 need not absolutely necessarily be made to be flush with the outer peripheral side surface 41a of the sealing resin 41; it would also be acceptable for the step portion 23 of the grounding terminal 20 to be formed at a position at which a difference in level is present against the outer peripheral side surface 41a of the sealing resin 41. However, if a construction is adopted in which a difference in level is provided between the step portion 23 of the grounding terminal 20 and the outer peripheral side surface 41a of the sealing resin 41, then it is desirable to ensure that the step portion 23 of the grounding terminal 20 is more toward the external periphery than the outer peripheral side surface 41a of the sealing resin 41. If this condition is satisfied, then it becomes simple and easy to cover the metallic shielding layer 51 over the difference in level between the step portion 23 of the grounding terminal 20 and the outer peripheral side surface 41a of the sealing resin 41.

In the second through the sixth embodiments described above, examples of constructions were shown in which the step portions 23 were provided to the grounding terminals 20. However, as explained in connection with the second manufacturing method for the semiconductor device 1 of the first embodiment, in these second through sixth embodiments as well, it would be possible to adopt a construction in which the grounding terminal 20 has no step portion 23, in other words, a construction in which the grounding terminal 20 has only an inner peripheral portion 21, but does not have any outer peripheral portion 22.

In the semiconductor device manufacturing methods described above, as examples, methods were shown in which the plurality of semiconductor devices 1 were obtained by initially forming the plurality of electronic component structures 10 upon the base member 71 as unified together by their grounding terminals 20a and their sealing resin masses 41, and by cutting through the grounding terminals 20a and the sealing resin 41 after having formed the metallic shielding layer 51. However, it would also be acceptable to form the plurality of electronic component structures 10 by mutually separating the grounding terminals 20a and the sealing resin mass 41 upon the base member 71, and only then to form the metallic shielding layers 51 over each of the electronic component structures 10.

In the third through the sixth embodiments of the present invention (refer to FIGS. 10 through 13), the grounding terminals 20 were shown as having rectangular shapes. However, the grounding terminals 20 could be made in other shapes, such as, for example, circular shapes, elliptical shapes, polygonal shapes other than rectangles, or combinations of these shapes or the like.

While various embodiments have been explained in the above description, the present invention is not to be considered as being limited by the details of these embodiments. Other variations that are considered to be within the range of the technical concept of the present invention are also to be understood as being within the scope of the present invention.

The content of the disclosure of the following priority application is hereby incorporated herein by reference.

Japanese Patent Application 2015-136216 (filed on 7 Jul. 2015).

REFERENCE SIGNS LIST 1, 1A: semiconductor device
10: electronic component structure
11, 15: islands
12: signal terminal
20, 20a: grounding terminals
21: inner peripheral portion
22: outer peripheral portion
23: step portion
24: separating portion
31, 35: semiconductor chips
32: bonding wire (electrically conductive connection member)
41: sealing resin
41a: outer peripheral side surface
41b: upper surface
51: metallic shielding layer
71: base member

The invention claimed is:

1. A semiconductor device manufacturing method, comprising:
 forming, upon an upper surface of a base member, an electronic component structure in which an island, signal terminals, and a grounding terminal are formed by plating, the grounding terminal is disposed outside of an external peripheral side of the signal terminals and around an entire periphery of the electronic component structure, a semiconductor chip is mounted upon an upper surface of the island, and electrodes of the semiconductor chip and the signal terminals are electrically connected together by electrically conductive connection members;
 sealing the electronic component structure with sealing resin;
 removing a portion of the sealing resin corresponding to at least a portion of the grounding terminal;

covering a metallic shielding layer over an outer peripheral side surface of the sealing resin and at least the portion of the grounding terminal; and detaching the base member from the island, the signal terminals, the grounding terminal, and the sealing resin.

2. The semiconductor device manufacturing method according to claim 1, wherein the island, the signal terminals, and the grounding terminals are formed upon the base member by electroforming.

3. The semiconductor device manufacturing method according to claim 1, wherein:

when removing the portion of the sealing resin corresponding to at least the portion of the grounding terminal, an upper portion of the grounding terminal is removed so as to form a step portion on the grounding terminal; and when forming the metallic shielding layer upon at least the portion of the grounding terminal, the metallic shielding layer is formed upon at least a portion of the step portion of the grounding terminal.

4. The semiconductor device manufacturing method according to claim 1, wherein:

when forming the electronic component structure upon the base member, along with forming upon the base member a plurality of electronic structures adjacent to one another including a first electronic component structure and a second electronic component structure, also a first grounding terminal that is the grounding terminal of the first electronic component structure, and a second grounding terminal that is the grounding terminal of the second electronic component structure, are integrated together; and after having detached the base member, the first grounding terminal and the second grounding terminal that were integrated together are further cut apart, and the first grounding terminal and the second grounding terminal are separated.

5. The semiconductor device manufacturing method according to claim 1, wherein the metallic shielding layer has at least one layer that is formed by sputtering.

6. A semiconductor device manufacturing method, comprising:

forming, upon an upper surface of a base member, an electronic component structure in which an island, signal terminals, and a grounding terminal disposed on an external peripheral side of the signal terminals are formed, a semiconductor chip is mounted upon an upper surface of the island, and electrodes of the semiconductor chip and the signal terminals are electrically connected together by electrically conductive connection members;

sealing the electronic component structure with sealing resin;

removing a portion of the sealing resin corresponding to at least a portion of the grounding terminal;

covering a metallic shielding layer over an outer peripheral side surface of the shielding resin and at least the portion of the grounding terminal; and detaching the base member from the island, the signal terminals, the grounding terminal, and the sealing resin, wherein after having detached the base member from the island, the signal terminals, the grounding terminal, and the sealing resin, further the island, the signal terminals, the grounding terminal, and the sealing resin covered by the metallic shielding layer are mounted upon dicing tape.

* * * * *